US006967365B2

(12) United States Patent
Summerfelt et al.

(10) Patent No.: US 6,967,365 B2
(45) Date of Patent: Nov. 22, 2005

(54) FERROELECTRIC MEMORY CELL WITH ANGLED CELL TRANSISTOR ACTIVE REGION AND METHODS FOR FABRICATING THE SAME

(75) Inventors: Scott Robert Summerfelt, Garland, TX (US); Katsushi Boku, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/620,196

(22) Filed: Jul. 15, 2003

(65) Prior Publication Data

US 2005/0012125 A1 Jan. 20, 2005

(51) Int. Cl.[7] ........................ H01L 29/76; H01L 29/94; H01L 31/062; H01L 31/113; H01L 31/119

(52) U.S. Cl. ...................... 257/295; 257/296; 257/303; 257/306

(58) Field of Search ................................ 257/295–310

(56) References Cited

U.S. PATENT DOCUMENTS

| | | | | |
|---|---|---|---|---|
| 5,198,384 | A | 3/1993 | Dennison | |
| 6,444,542 | B2 | 9/2002 | Moise et al. | |
| 6,790,676 | B2 * | 9/2004 | Cerva et al. | 438/3 |

FOREIGN PATENT DOCUMENTS

| | | | | |
|---|---|---|---|---|
| JP | 05029579 A * | 2/1993 | | H01L 27/108 |

* cited by examiner

*Primary Examiner*—Thien F. Tran
(74) *Attorney, Agent, or Firm*—Frederick J. Telecky, Jr.; W. James Brady, III

(57) ABSTRACT

Ferroelectric memory cells and fabrication methods are provided in which the memory cell comprises a ferroelectric capacitor in a capacitor layer above a semiconductor body, and a cell transistor with first and second source/drains formed in an active region of the semiconductor body. The active region extends along a first axis in the semiconductor body, and the cell includes a gate electrically coupled with a wordline structure that extends along a second axis, wherein the first axis and the second axis are oblique.

17 Claims, 12 Drawing Sheets

FERROELECTRIC MEMORY CELL WITH ANGLED CELL TRANSISTOR ACTIVE REGION AND METHODS FOR FABRICATING THE SAME

CROSS-REFERENCE TO RELATED PATENT/PATENT APPLICATIONS

This application is related to co-pending U.S. patent application Ser. No. 10/441,619 filed May 20, 2003, TI Case No. 36207, which is entitled “Ferroelectric Memory Cell and Methods for Fabricating the Same”.

FIELD OF INVENTION

The present invention relates generally to semiconductor devices and more particularly to ferroelectric memory cells and fabrication methods therefor.

BACKGROUND OF THE INVENTION

Memory is used for storage of data, program code, and/or other information in many electronic products, such as personal computer systems, embedded processor-based systems, video image processing circuits, portable phones, and the like. Memory cells may be provided in the form of a dedicated memory integrated circuit (IC) or may be embedded (included) within a processor or other IC as on-chip memory. Ferroelectric memory, sometimes referred to as “FRAM” or “FERAM”, is a non-volatile form of memory commonly organized in single-transistor, single-capacitor (1T1C) or two-transistor, two-capacitor (2T2C) configurations, in which each memory cell includes one or more access transistors. The cells are typically organized in an array, and are selected by plateline and wordline signals from address decoder circuitry, with the data being read from or written to the cells along bitlines using sense amp circuits.

Continuing design efforts are directed toward increasing memory density in semiconductor products, by decreasing the size of the cells. In constructing ferroelectric memory cells, the plateline and wordline signals, as well as the bitlines, need to be routed to the appropriate terminals of the cell transistor and capacitor. In a 1T-1C cell, the ferroelectric capacitor is connected between a source/drain of the cell transistor and the plateline signal. The other transistor source/drain is connected to a bitline and the transistor gate is connected to the wordline signal. The configuration of the cell components and interconnect routing structures plays a role in reducing the cell size in an array.

One layout architecture for ferroelectric memory arrays is referred to as ‘capacitor under bitline’, in which the bitlines are routed in an interconnect layer above the layer or level at which the ferroelectric capacitor is formed, where the bitlines are coupled with individual cell transistors using conductive bitline structures (e.g., contacts or vias) extending through the capacitor layer. The capacitor under bitline architecture is preferred for many high-density memories, including embedded memories. In many semiconductor devices employing ferroelectric memory arrays, FRAM processing is performed following standard logic front end processing (e.g., after contact formation in an initial interlevel or interlayer dielectric layer) and before back end processing (e.g., prior to fabrication of overlying metal interconnect layers). In the capacitor under bitline configuration, area must be dedicated to routing the bitline connection from the underlying cell transistor source/drain to the interconnect layer at which the bitline routing structures are created. This requires a bitline contact/via structure that passes vertically through the ferroelectric capacitor level. For planar ferroelectric memory cells of small dimensions (e.g., areas below about 0.25 $um^2$), the size of the ferroelectric capacitor begins to control the cell size. Consequently, the goal of reducing ferroelectric memory cell area and increasing FRAM cell density is facilitated by maximizing the ferroelectric capacitor area in the capacitor layer through which the bitline contact passes.

Another goal in the design and fabrication of ferroelectric memories is to provide reliable transfer of the data to and from the memory cells. In a typical FRAM array, sense amp circuits are coupled with the array bitlines for sensing data from selected memory cells during read operations and for applying voltages to the cells in write operations. Data is read from a ferroelectric memory cell capacitor by connecting a reference voltage to a first bit line and connecting the cell ferroelectric capacitor between a complimentary bit line and a plate line signal voltage, and interrogating the cell. There are several techniques to interrogate a FRAM cell. Two common interrogation techniques are ‘on-pulse’ sensing and ‘after-pulse’ sensing. For on-pulse sensing, the plate line voltage is stepped from ground (Vss) to a supply voltage (Vdd). In the after-pulse sensing the plate line voltage is pulsed from Vss to Vdd and then back to Vss. In either case, the application of the voltage to the plate line provides a differential voltage on the bit line pair, which is connected to the sense amp input terminals. The reference voltage is typically supplied at an intermediate voltage between a voltage ($V_{“0”}$) associated with a capacitor programmed to a binary “0” and that of the capacitor programmed to a binary “1” ($V_{“1”}$). The resulting differential voltage at the sense amp terminals represents the data stored in the cell, which is buffered and applied to a pair of local IO lines.

The transfer of data between the ferroelectric memory cell, the sense amp circuit, and the local data bit lines is controlled by various access transistors, typically MOS devices, with switching signals being provided by control circuitry in the device. In a typical ferroelectric memory read sequence, two sense amp bit lines are initially pre-charged to ground, and then floated, after which a target ferroelectric memory cell is connected to one of the sense amp bit lines and interrogated. Thereafter, a reference voltage is connected to the remaining sense amp bit line, and a sense amp senses the differential voltage across the bit lines and latches a voltage indicative of whether the target cell was programmed to a binary “0” or to a “1”.

Capacitance along the array bitlines, referred to as the ‘bitline capacitance’, degrades the signal level of the data being transferred to or from the selected cell along the bitline (e.g., reduces the signal to noise ratio (SNR)). The bitline capacitance typically limits the number of array cells that can be associated with a given sense amp for a given sense margin. However, the goal of higher array cell density is facilitated by increasing the number of ferroelectric memory cells coupled with each bitline, thereby reducing the total number of sense amps required. Thus, for reliable sensing of FRAM cell data and for increasing FRAM cell density, it is important to minimize or reduce the capacitance along the bitlines in the array.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later. The invention relates to ferroelectric memory devices with angled cell transistor active regions as well as methods for fabricating the same, which may be employed to reduce or minimize bitline capacitance associated with the FRAM cells, while allowing reduced or minimized cell size (e.g., increased cell density).

One aspect of the invention provides ferroelectric memory arrays and cells therefor, where the ferroelectric memory cells comprise a ferroelectric capacitor formed in a capacitor layer above a semiconductor body, as well as a cell transistor. The cell transistor comprises first and second source/drains formed in an active region of the semiconductor body, where the active region extends along a first axis in the semiconductor body. The transistor also comprises a gate electrically coupled with a wordline structure that extends along a second axis, wherein the first axis and the second axis are oblique. In one implementation illustrated and described herein, the ferroelectric memory cell comprises a bitline contact coupled with the second source/drain that extends through the capacitor layer, where the bitline contact passes through the capacitor layer proximate a corner of the ferroelectric capacitor. In this example, the location of the bitline contact near the capacitor corner facilitates compact cell designs while the angled active region provides reduced bitline capacitance. The angled active region may be of any shape, such as straight or curved. For example, S-shaped active regions may be provided that extend at an oblique angle with respect to the array wordlines, wherein the active region axis passes through first and second ends of the active region. In addition, the active regions may be shared by two adjacent cell transistors in the array. Furthermore, portions of the active regions may extend parallel and/or perpendicular to the wordline axis where the overall active region is oblique with respect to the wordline direction, and the wordline structures themselves need not be straight within the scope of the invention.

Another aspect of the invention provides a method for fabricating a ferroelectric memory cell accessible along a bitline using a plateline signal and a wordline signal for storing data. The method involves forming a wordline structure over a semiconductor body along an axis, forming a gate over the semiconductor body that is coupled with the wordline structure, and forming first and second source/drains in an active region of a semiconductor body extending on opposite sides of the gate at an oblique angle with respect to the axis. The method further includes forming a ferroelectric capacitor in a capacitor layer above the semiconductor body, coupling a first electrode of the ferroelectric capacitor with a plateline structure, coupling the first source/drain with a second electrode of the ferroelectric capacitor, and coupling the second source/drain with a bitline structure. The second source/drain and the bitline structure may be coupled by forming a bitline contact extending from the second source/drain beneath the capacitor layer to a layer above the capacitor layer, where the bitline contact passes through the capacitor layer proximate a corner of the ferroelectric capacitor.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1A:
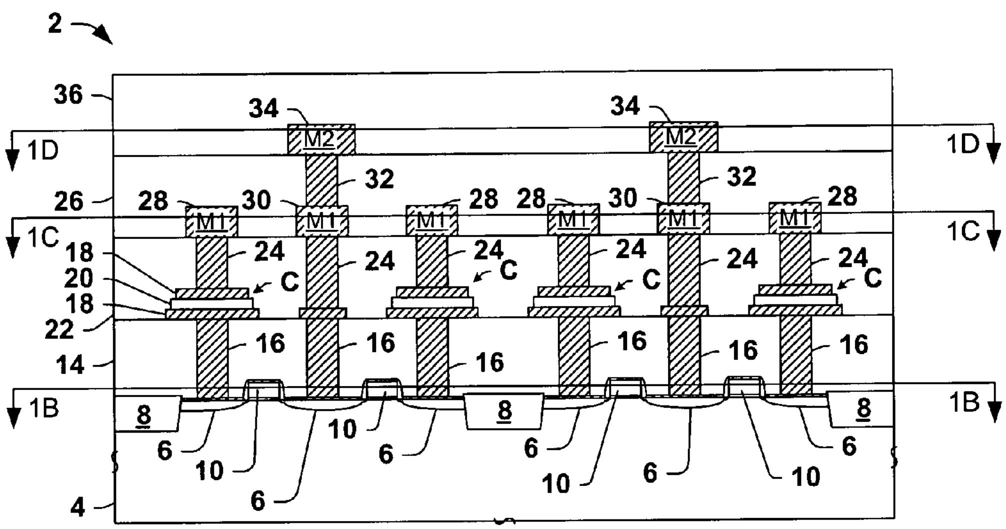
FIG. 1A is a partial side elevation view in section illustrating a portion of a capacitor under bitline ferroelectric memory array having non-angled active regions with bitline contacts located at the corners of the ferroelectric memory cell capacitors.

The present invention will now be described with reference to the attached drawing figures, wherein like reference numerals are used to refer to like elements throughout.

The invention relates to semiconductor devices and fabrication methods in which ferroelectric memory cell transistors are formed with angled active regions to reduce or minimize bitline capacitance associated with the FRAM cells, while allowing reduced or minimized cell size (e.g., increased cell density). Several implementations of the invention are illustrated and described below in the context of open-bitline 'capacitor under bitline' memory array architectures where bitline contact structures are positioned at the corners of the ferroelectric capacitors for coupling cell transistors with bitline routings in interconnect layers formed above the capacitors. However, the invention is not limited to the specific cell types and architectures illustrated and described herein, wherein implementations using 1T-1C, 2T-2C, or other cell types and folded-bitline, open-bitline, chain-FRAM, and other array architecture types are contemplated as falling within the scope of the present invention and the appended claims. Furthermore, the invention is illustrated and described below in association with various exemplary cell transistor active regions situated at an oblique angle with respect to straight wordline structures in ferroelectric memory arrays. However, the active regions may be of any shape, including but not limited to those specifically illustrated in the figures, and the wordline structures need not be straight within the scope of the invention.

In addition, the exemplary semiconductor devices are illustrated herein with ferroelectric capacitors formed in a dielectric layer or level after front-end contact formation and prior to formation of overlying interconnect levels or layers. However, the various aspects of the invention may be employed at other points in a fabrication process, for example, wherein the ferroelectric capacitors and bitline routing structures are individually formed at any level in a multi-level semiconductor device design, with bitline signals being routed through the capacitor level. Furthermore, the invention may be employed in association with memory cell capacitors formed using any type of ferroelectric materials and with any form of cell transistor. The invention may be carried out in association with devices fabricated on or in any type of semiconductor body, including but not limited to silicon substrates or SOI wafers. In this regard, the invention is not limited to the examples illustrated and described herein, and all variant implementations are contemplated as falling within the scope of the present invention and the appended claims.

FIGS. 1A–1D illustrate a portion of an exemplary open-bitline 1T-1C ferroelectric memory array in a semiconductor device 2, with bitline contacts formed proximate the corners of the ferroelectric cell capacitors. FIG. 1A shows a sectional side view of the device 2 taken along lines 1A—1A in FIGS. 1B–1D, which provide sectional top views of the device 2 along lines 1B—1B, 1C—1C, and 1D—1D, respectively, of FIG. 1A. The device 2 includes a silicon substrate or SOI wafer 4 in which transistor source/drains 6 are formed in active regions 12 separated by isolation structures 8, wherein gate structures 10 are formed over channel regions of the substrate 4 as part of polysilicon wordline structures. MOS type cell transistors are thus formed by the gates 10 and the source/drains 6, wherein the source/drains 6 are formed by doping portions of active regions 12 in the substrate (FIG. 1B), and wherein the source/drains 6 that are coupled with bitline structures are shared between adjacent transistors.

Figure 1B:
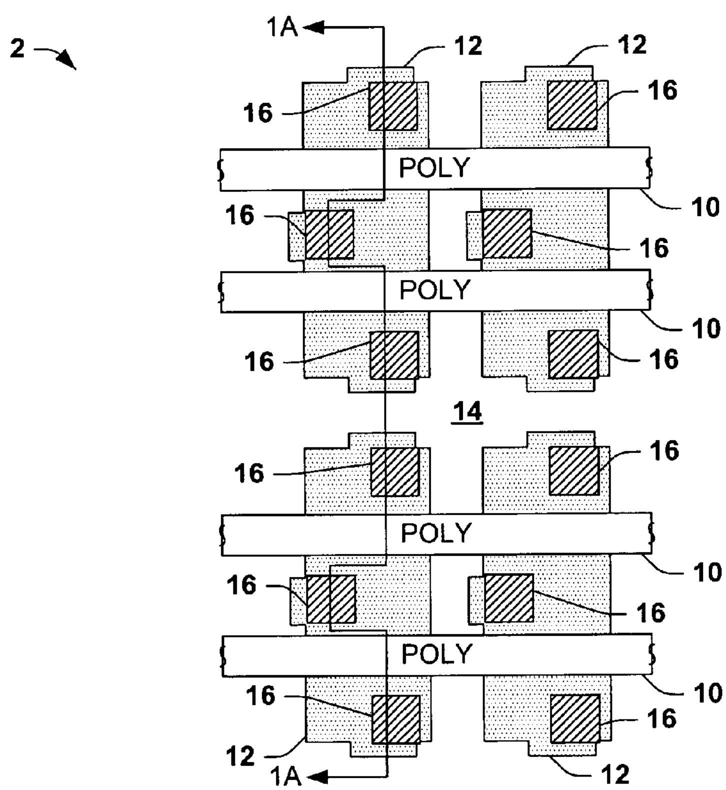
FIG. 1B is a partial top plan view of the array in section taken along line 1B—1B of FIG. 1A illustrating wide cell transistor active regions.
Figure 1C:
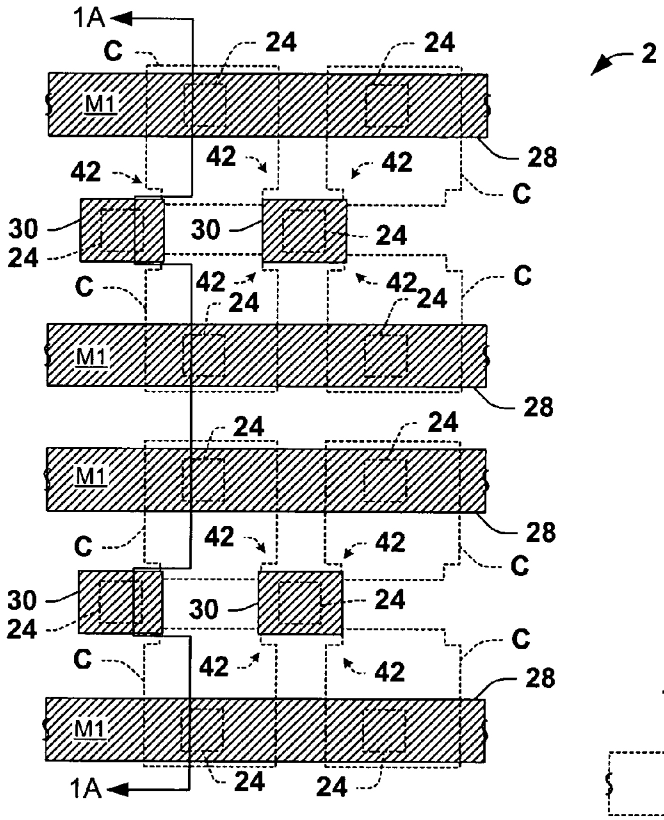
FIG. 1C is a partial top plan view of the array in section taken along line 1C—1C of FIG. 1A illustrating a first metalization layer as well as underlying ferroelectric capacitors and bitline contact/via structures passing through the capacitor layer proximate the ferroelectric capacitor corners.
Figure 1D:
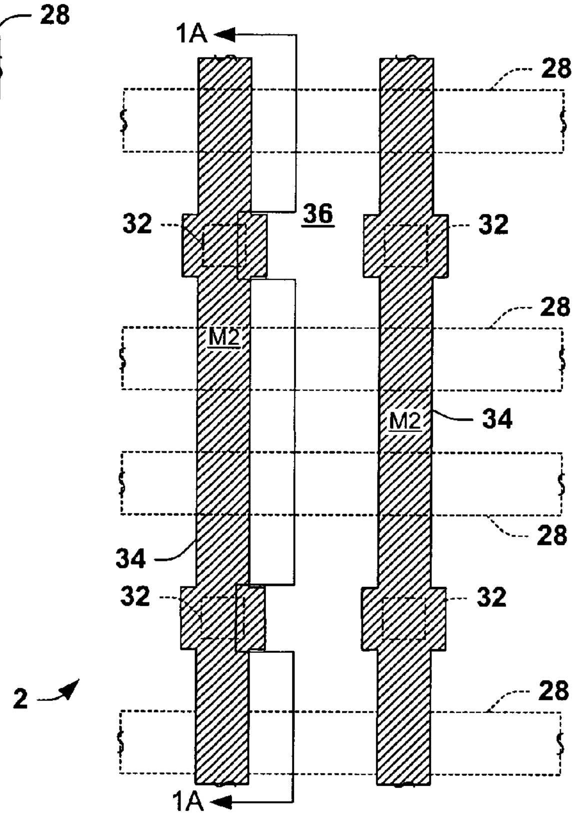
FIG. 1D is a partial top plan view of the array in section taken along line 1D—1D of FIG. 1A illustrating a second metalization layer.

A first interlevel or interlayer dielectric (ILD) layer 14 is formed over the transistors and the substrate 4, through which conductive contacts 16 are formed for interconnection of the transistor gate and source/drain terminals 10 and 6, respectively. Ferroelectric cell capacitors C are formed over the dielectric layer 14, including upper and lower conductive electrodes or plates 18 and a ferroelectric material 20 between the electrodes 18. As seen in FIGS. 1A and 1C, a second dielectric layer 22 is formed over the capacitors C and the first dielectric 14, and conductive via structures 24 are formed through the dielectric 22 to couple with the upper capacitor plates 18 and the contacts 16 of the first layer. A third dielectric layer 26 is formed over the dielectric 22, and a first layer of metal interconnect structures (M1) are formed therein, including conductive plateline routing structures 28 and landing pads 30 for the bitline connections. Bitline connection vias 32 are formed through the dielectric 26 to connect the landing pads 30 with a bitline structure 34 in a second metalization layer M2 in a subsequent dielectric layer 36 (FIGS. 1A and 1D).

As seen in FIGS. 1A and 1C, the conductive bitline contacts 24 extend vertically through the dielectric layer 22 (capacitor layer) near corners 42 of the capacitor structures C, to facilitate optimization of the capacitor area in the cell area while providing a minimum spacing between the ferroelectric capacitor structures C and the bitline contacts 24 in the capacitor layer. The inventors have appreciated that this facilitates maximizing the capacitor size relative to the cell area and/or facilitates reduction in the cell area for increasing ferroelectric memory cell density in the device 2. However, to accommodate the location of the bitline contacts 24 near the capacitor corners 42, the source/drains 6 are staggered in the active regions 12, wherein the active regions 12 in the device 2 are formed perpendicular to the wordline direction (FIG. 1B). In this regard, prior cell transistors provide perpendicular active regions with the source/drains generally aligned in the direction of the active region. For the device 2, the staggering of the source drains 6 requires a wider active areas 12, with less spacing distance between adjacent active areas. Thus while the illustrated placement of the bitline contacts or vias 24 (FIGS. 1A and 1C) facilitates optimizing the sizing of the ferroelectric capacitors C with respect to the overall cell area, the staggering of the source/drains 6 within each of the active regions 12 causes an increase in the size of the active areas 12 in the direction parallel to the polysilicon wordline/gate structures 10.

The inventors have appreciated that the wider active areas 12 of the device 2 (FIG. 1B) result in higher parasitic capacitance on the bitlines of the ferroelectric memory array. This increased bitline capacitance may unduly limit the number of cells that can be associated with a particular bitline, and hence increase the number of sense amps necessary for the device 2. In addition, the higher bitline capacitance degrades (e.g., loads) the data signals on the bitline, thereby degrading signal to noise ratio (SNR) in the device 2, forcing the sense amp design to accommodate a smaller sense margin to distinguish between "0" and "1" data states. In this regard, the bitline contacts 24 and the corresponding source/drains 6 in the array lie between two adjacent or neighboring cell transistors, wherein all the cell transistors along a particular bitline in the array are always connected to the bitline whether activated or not.

The bitline capacitance contribution of these ferroelectric memory cell transistors has three basic components, each of which increases as the active regions 12 become wider and closer together in the device 2. The first component is a capacitance with respect to the grounded substrate 4. For an NMOS transistor (e.g., the source/drain regions 6 are doped with n-type impurities), an n-p junction exists with respect to the grounded substrate 4. Because both the silicided source/drain contact and the substrate 4 act as capacitor plates with the source drain 6 acting as a capacitor dielectric, a first bitline capacitor is formed between the bitline and ground for each transistor on the bitline. For this first bitline capacitance component, increasing the size of the silicided source/drain contact at the bitline connection increases the capacitor area and hence increases the bitline capacitance.

A second (e.g., somewhat smaller) bitline capacitance exists with respect to the cell wordline (e.g., gate 10) through the dielectric sidewall spacer from the bitline source/drain silicide to the silicided gate contact. During any given memory access operation, one of the wordlines (e.g., gates 10) may be activated, while other (e.g., non-selected) wordlines are typically held at ground. Therefore, the second capacitance component along a given wordline includes one capacitance to the active wordline voltage, and a number of such capacitances to ground (e.g., corresponding to the non-activated cell transistors). As with the first capacitance component, increasing the transistor width to accommodate the staggered source/drains 6 in the device 2 also increases this second bitline capacitance component. A third (e.g., still smaller) bitline capacitance contribution results from the spacing of one active region 12 to adjacent or neighboring active regions. For this component, the capacitance also increases as the active regions become wider and hence closer to one another.

Referring now to FIGS. 2A–2H, the present invention provides angled active regions that can be used to accommodate placement of the bitline contacts near the ferroelectric capacitor corners, while also facilitating minimization of the transistor widths and maximizing the spacing of neighboring active regions. This, in turn, allows minimization or reduction of the bitline capacitance, and hence improved sense margins and/or maximization of the number of cells per bitline in a ferroelectric memory array. While angled active regions may generally be less desirable than simple vertical designs for logic circuits due to potential current crowding and reliability issues, the inventors have appreciated that reliability for memory cell transistors is less of a problem, since the cell transistors are activated relatively infrequently. In this regard, the invention contemplates cell transistors with angled active regions, which may be combined with logic transistors having perpendicular active regions with respect to gate structures in a semiconductor device. Furthermore, the inventors have appreciated that significant performance advantages are possible using the various aspects of the invention, wherein reductions in bitline capacitance may be achieved compared with the relatively wide active regions 12 illustrated above.

In accordance with the invention, a portion of an exemplary semiconductor device 102 is illustrated in FIGS. 2A–2H, which comprises an array of 1T-1C ferroelectric memory cells 106 having cell transistor active regions 122 oriented at an oblique angle THETA with respect to a wordline axis or direction 105. The device 102 is shown in simplified form for purposes of illustrating the various aspects of the invention, wherein the structures are not necessarily drawn to scale, and wherein the structures generally may be fabricated using any semiconductor processing techniques.

Figure 2A:
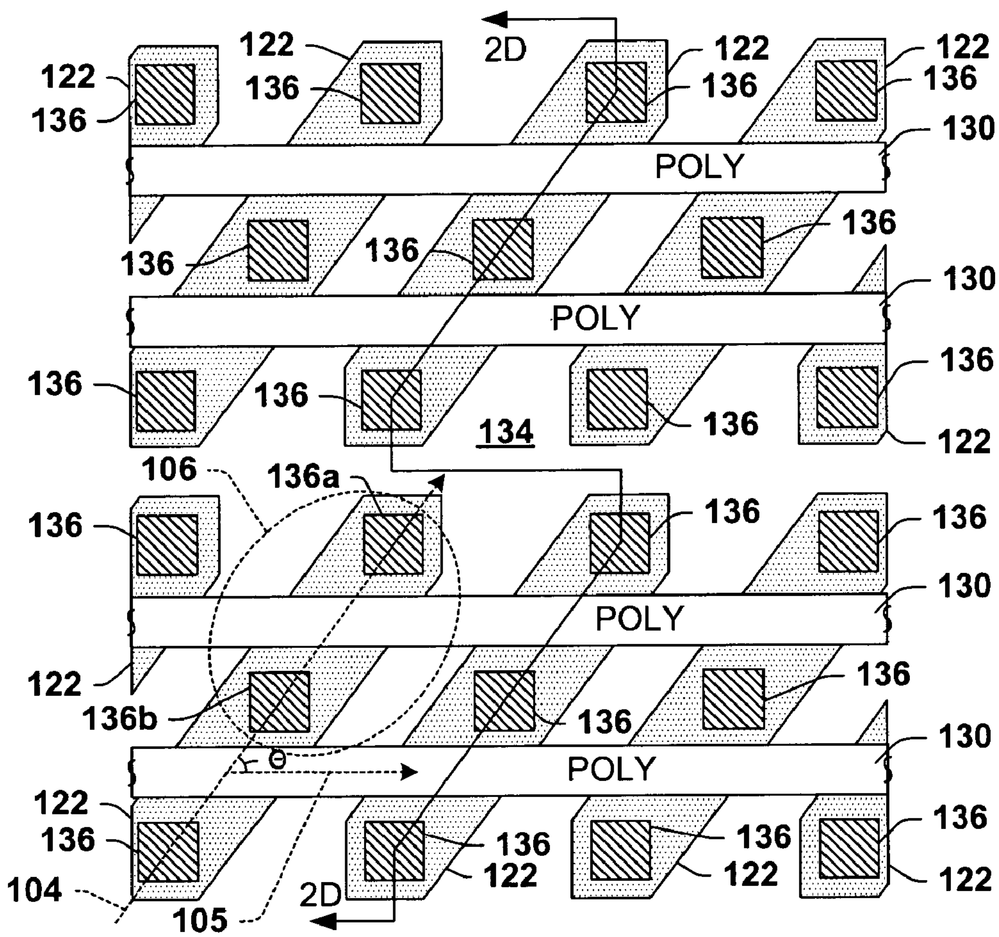
FIG. 2A is a partial top plan view in section taken along line 2A—2A of FIG. 2D illustrating a portion of an exemplary ferroelectric memory device with angled active regions in accordance with the present invention.
Figure 2B:
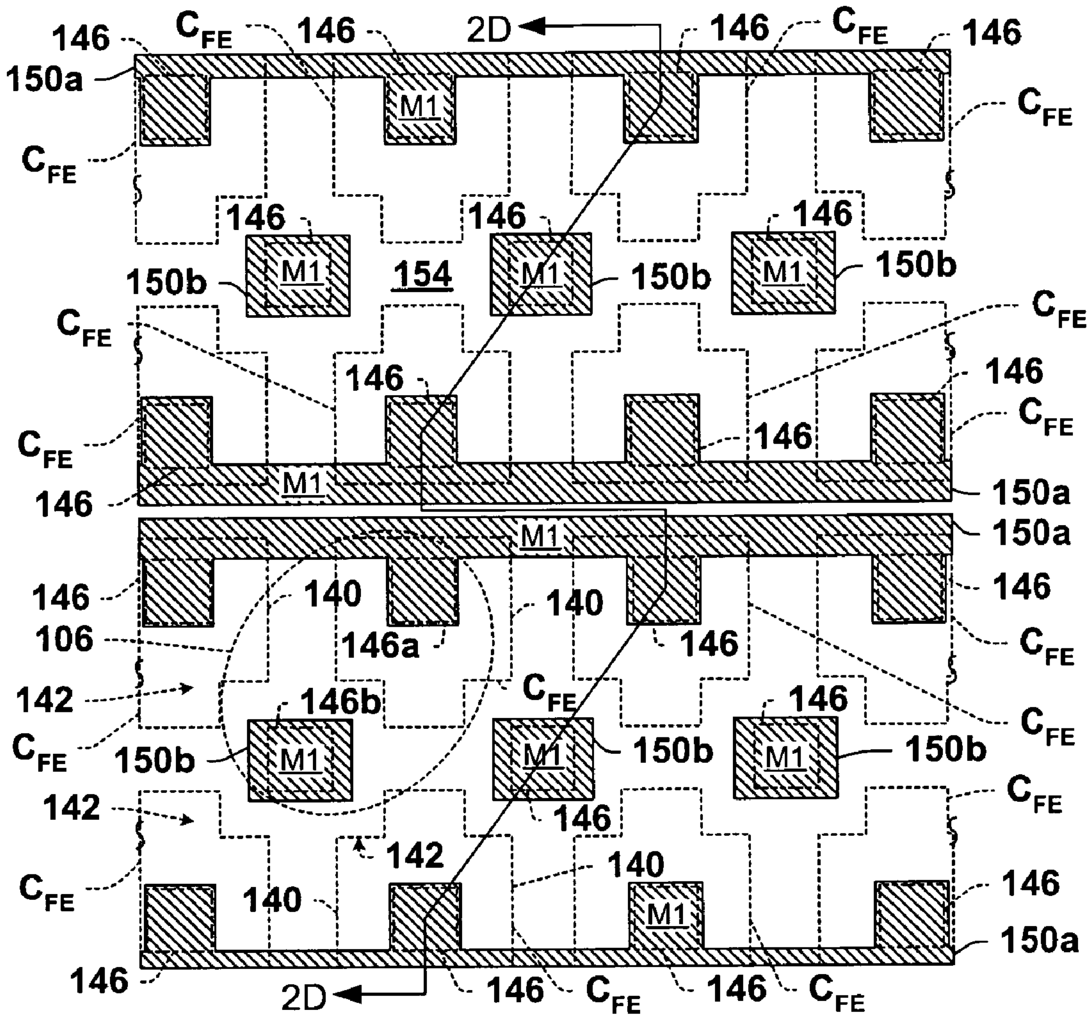
FIG. 2B is a partial top plan view in section taken along line 2B—2B of FIG. 2D illustrating another portion of the device of FIGS. 2A–2H wherein conductive bitline contact/via structures are located proximate to ferroelectric cell capacitor corners.
Figure 2C:
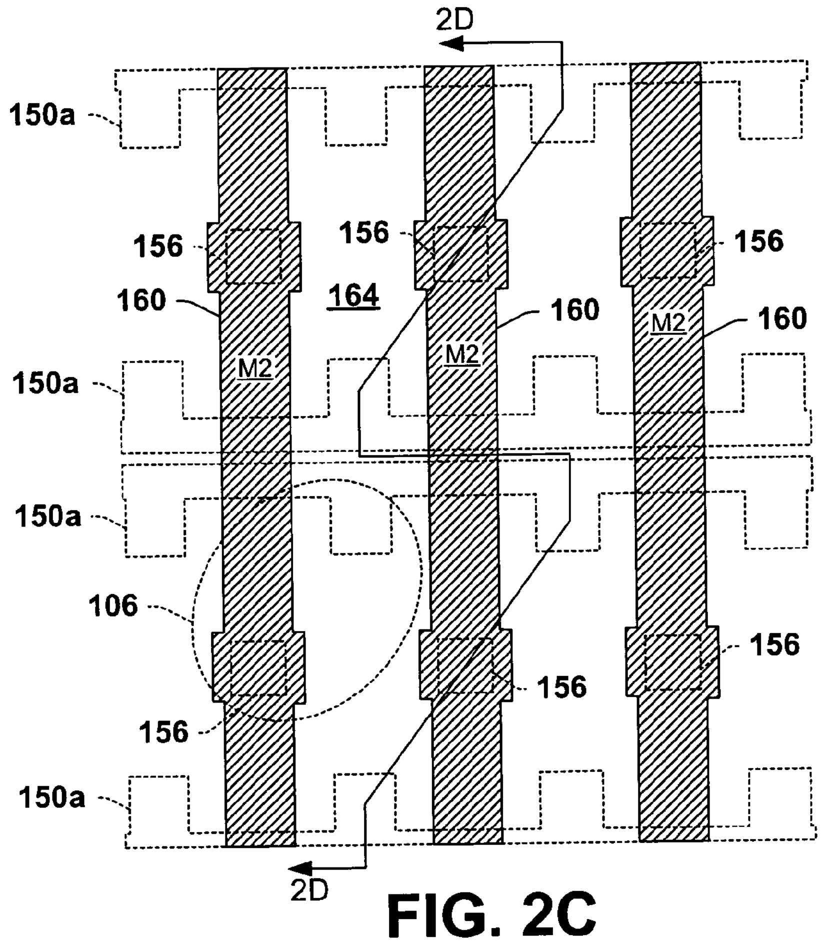
FIG. 2C is a partial top plan view in section taken along line 2C—2C of FIG. 2D illustrating another portion of the device of FIGS. 2A–2H.
Figure 2D:
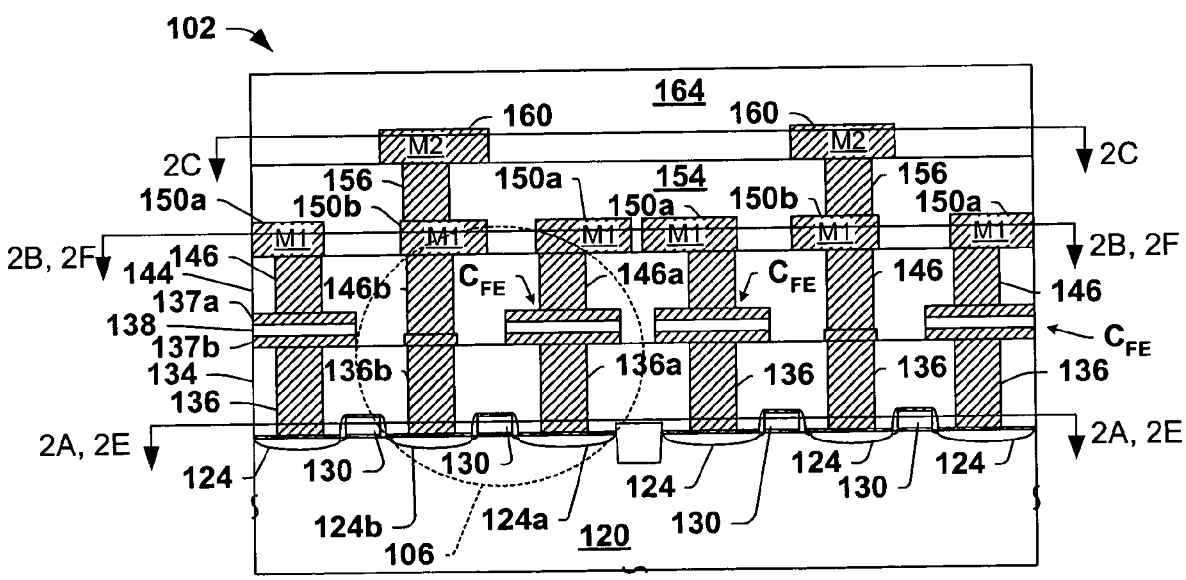
FIG. 2D is a partial side elevation view in section taken along lines 2D—2D of FIGS. 2A–2C further illustrating the device of FIGS. 2A–2H.
Figure 2E:
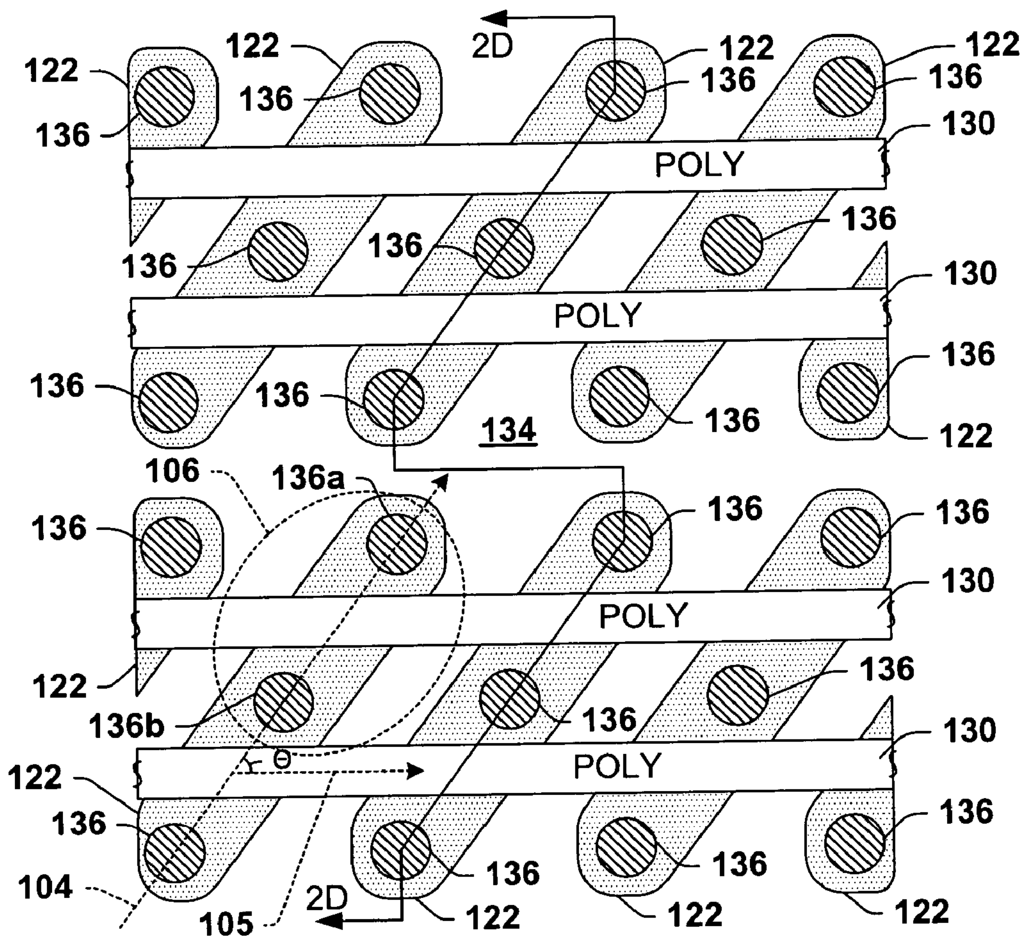
FIG. 2E is a partial top plan view in section taken along line 2E—2E of FIG. 2D illustrating feature rounding of the angled active regions in the device of FIGS. 2A–2H.
Figure 2F:
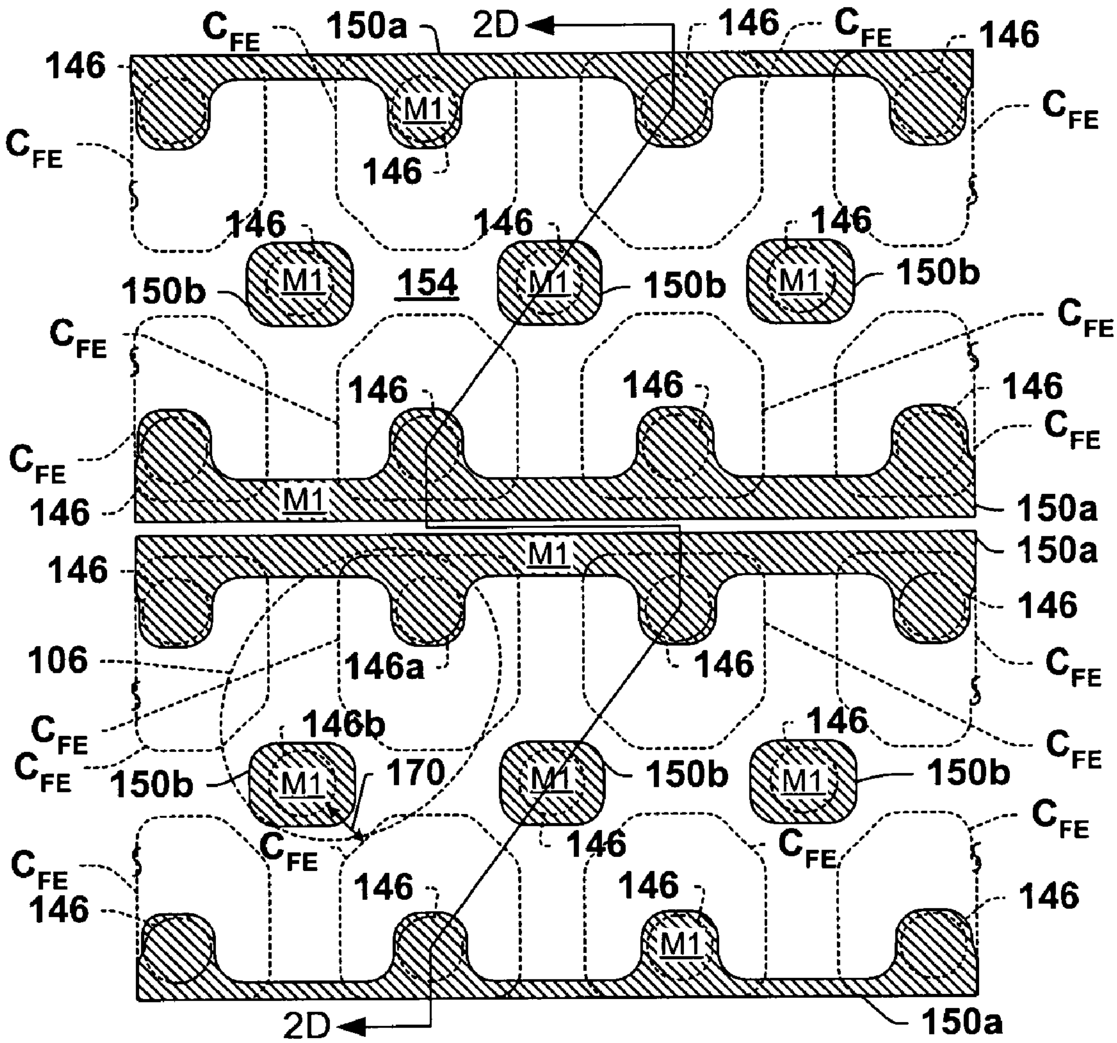
FIG. 2F is a partial top plan view in section taken along line 2F—2F of FIG. 2D further illustrating feature rounding of ferroelectric capacitor structures and bitline contact/via structures in the device of FIGS. 2A–2H.
Figure 2G:
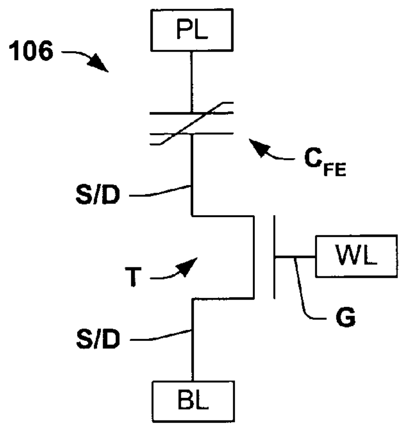
FIG. 2G is a schematic diagram illustrating an exemplary 1T-1C ferroelectric memory cell in the device of FIGS. 2A–2H.

As seen in FIG. 2G, the individual ferroelectric memory cells 106 comprise a MOS transistor T having first and second source/drains S/D and a gate G, as well as a ferroelectric cell capacitor CFE. Although illustrated in the context of 1T-1C cells, the invention finds utility in association with other cell types, including but not limited to 2T-2C ferroelectric memory cells. Further, while open bitline array structures are provided in the exemplary device 102 (e.g., FIG. 2H), the invention may alternatively be employed in other array configurations, including but not limited to folded bitline and chain FRAM architectures. In the illustrated examples, the cell transistor gate G is coupled with a wordline WL (e.g., formed as part of a wordline structure) and a first source/drain is coupled with a bitline BL. A first (e.g., upper) capacitor electrode or plate is coupled with a plateline PL and a second (e.g., lower) capacitor plate is coupled with a second transistor source/drain.

Figure 2H:
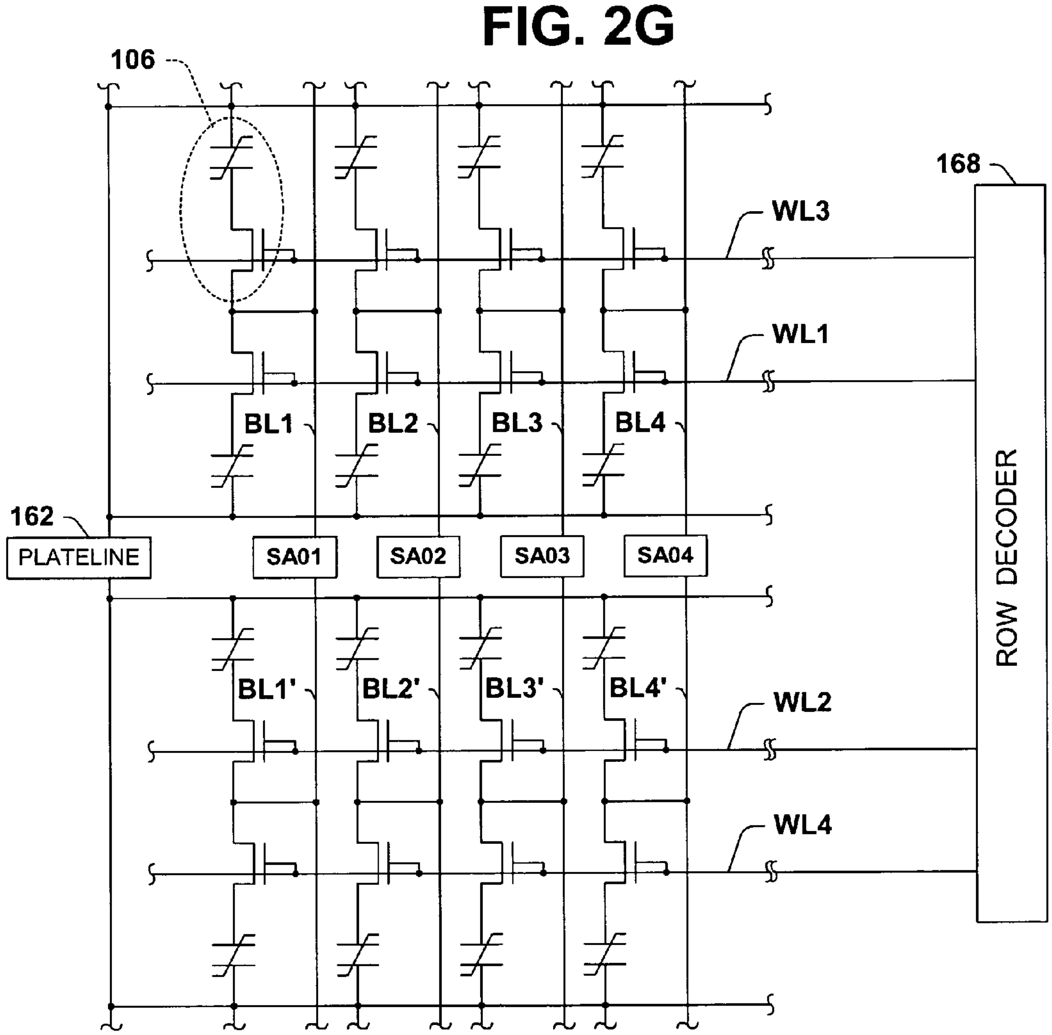
FIG. 2H is a schematic diagram illustrating an exemplary open-bitline ferroelectric memory array configuration in the device of FIGS. 2A–2H in accordance with the present invention.

FIG. 2D illustrates a side sectional view of a portion of the device 102 taken along lines 2D—2D in FIGS. 2A–2C, and FIGS. 2A–2C illustrate sectional top views of the device 102 taken along section lines 2A—2A, 2B—2B, and 2C—2C, respectively, in FIG. 2D. For reference purposes, one exemplary ferroelectric memory cell 106 is circled in FIGS. 2A–2F, although the other cells in the array are generally similar. FIGS. 2E and 2F illustrate sectional top views of the device 102 taken along section lines 2E—2E and 2F—2F of FIG. 2D in the presence of feature rounding due to photolithographic processing in fabricating the device 102, and FIG. 2H illustrates an example of an open bitline array configuration in the device 102.

The exemplary device 102 is fabricated in a semiconductor body 120, such as a silicon wafer or an SOI wafer, having angled cell transistor active regions 122 formed in the semiconductor body 120 along an active region axis 104 (FIG. 2A). Cell transistor source/drains 124 (FIG. 2D) are formed in the active regions 122, wherein some of the source/drains 124 (e.g., those connected to the bitlines in this example) are shared between adjacent transistors in the array. Polysilicon gate/wordline structures 130 are formed over channel regions of the substrate 120 between the source/drains along a wordline axis 105 (FIG. 2A), wherein cell transistors are formed by the gates 130 and the source/drains 124. Although the exemplary device 102 employs straight wordline structures 130, other wordline shapes and orientations are possible within the scope of the invention, wherein the wordlines are formed along a wordline axis and the active regions are formed along corresponding active region axes 104 that are oblique with respect to the wordline axis 105.

A first interlevel or interlayer dielectric (ILD) layer 134 (ILDO) is formed over the transistors and the semiconductor body 120, and ILDO contacts 136 are formed through the ILD0 layer 134, where the contacts 136 may be formed of any conductive material or materials, such as tungsten or the like. Ferroelectric cell capacitor structures $C_{FE}$ are formed over the first dielectric layer 134, where the ferroelectric capacitors $C_{FE}$ individually comprise an upper or first conductive capacitor plate or electrode 137*a* and a second or lower electrode 137*b*, as well as a ferroelectric material 138 formed between the electrodes 137. The capacitor electrodes 137 may be formed of any suitable material or combination of multiple layers of materials. In one example, a diffusion barrier is first created comprising TiN formed over the interlayer dielectric 134 and the tungsten contact 136 via chemical vapor deposition (CVD) with a TiAlN film or a TiAlON being deposited using a physical vapor deposition (PVD) or other process. The bottom electrode material 137*b* may then be formed over the diffusion barrier, for example, comprising any conductive material such as Pt, Pd, PdOx, IrPt alloys, Au, Ru, $RuO_x$, (Ba,Sr,Pb)RuO3, (Sr,Ba,Pb)IrO3, Rh, $RhO_x$, $LaSrCoO_3$, $(Ba,Sr)RuO_3$, $LaNiO_3$, etc., or any stack or combination thereof.

Ferroelectric material 138 is deposited over the lower electrode material 137*b* using any appropriate deposition techniques such as metal organic chemical vapor deposition (MOCVD) using any suitable ferroelectric materials, including but not limited to $Pb(Zr,Ti)O_3$ PZT (lead zirconate titanate), doped PZT with donors (Nb, La, Ta) acceptors (Mn, Co, Fe, Ni, Al) and/or both, PZT doped and alloyed with $SrTiO_3$, $BaTiO_3$ or $CaTiO_3$, strontium bismuth tantalate (SBT) and other layered perovskites such as strontium bismuth niobate tantalate (SBNT) or bismuth titanate, $BaTiO_3$, $PbTiO_3$, Bi2TiO3, etc. The top electrode material 137*a* may be a single layer or a multi-layer conductive structure such as $IrO_x$, $RuO_x$, $RhO_x$, $PdO_x$, $PtO_x$, $AgO_x$, $(Ba,Sr)RuO_3$, $LaSrCoO_3$, $LaNiO_3$, $YBa_2Cu_3O_{7-x}$ with a noble metal layer thereover, wherein the layers 137*b*, 138, and 137*a* may be formed to any desired thickness in accordance with the invention.

The capacitor material layers are then patterned to define the ferroelectric capacitor structures $C_{FE}$ (FIGS. 2B and 2D) of any desired size (area) and shape, wherein the capacitor structures $C_{FE}$ comprise lateral sides 140 (FIG. 2B) and corners 142 between the sides 140. Referring particularly to the cell 106 circled in dashed line in FIGS. 2A–2F, the first dielectric layer 134 (ILD0) includes first and second conductive contacts 136*a* and 136*b*, respectively, wherein the first contact 136*a* electrically couples the lower capacitor electrode 137*b* with a first source/drain 124*a* of the cell transistor. The second conductive ILD0 contact structure 136*b* couples a second source/drain 124*b* to the overlying capacitor level or layer, which serves to connect the cell 106 with a bitline for reading and writing data.

A second dielectric layer 144 (ILD1) is formed over the first dielectric layer 134 and over the ferroelectric capacitor structures $C_{FE}$ (FIG. 2D). Conductive ILD1 via structures 146 are formed in the ILD1 dielectric layer 144, wherein the vias 146 may be formed using standard damascene or other interconnect processing techniques, using copper with suitable diffusion barrier layers or other conductive materials or stacks or combinations thereof. A third dielectric layer 154 (ILD2) is formed over ILD1 dielectric 144 and over the vias 146, and a first metal layer structure 150 (M1) is formed and patterned to provide conductive plateline routing structures 150*a* and landing pads 150*b* for the bitline connections. With respect to the exemplary (e.g., circled) cell 106, a first ILD1 via 146*a* couples the upper capacitor electrode 137*a* with the plateline structure 150*a* and the second ILD1 via 146*b* couples the bitline connection from the second source/drain 124*b* to a landing pad 150*b*. ILD2 vias 156 are formed in the third dielectric layer 154 for coupling to the bitline landing pads 150*b*.

A fourth dielectric layer 164 (ILD3) is then formed over the ILD2 layer 154 and the vias 156 and conductive bitline routing structures 160 are formed therein, as shown in FIGS. 2C and 2D. The illustrated bitline structure 160 corresponding to the exemplary cell 106 couples with the second source/drain 124*b* through the ILDO contact 136*b*, the ILD1 via 146*b*, the ILD2 landing pad 150*b*, and the ILD2 via 156. The various interlayer or interlevel dielectric layers of the device 102 are illustrated in simplified form, wherein one or all of these layers may individually comprise multiple dielectric layers. In addition, the interconnect structures and other conductive structures may be formed using single or dual damascene processing techniques or any other suitable methods for fabricating conductive interconnect structures isolated from one another by dielectric material.

As seen in FIGS. 2B and 2D, the individual conductive bitline structures, particularly the exemplary ILD1 via 146*b*, pass near the corners 142 of the capacitor structures $C_{FE}$, so as to allow a minimum spacing distance therebetween in the capacitor layer or level. This facilitates maximizing the capacitor size relative to the cell area and/or facilitates reduction in the cell area for increasing ferroelectric memory cell density in the device 102. Any location of the conductive bitline contact or via structures 146*b* proximate or near to the capacitor corner is contemplated within the scope of the invention, wherein the bitline structure is located closer to the corner 142 than to the lateral capacitor sides 140 (FIG. 2B). The ferroelectric capacitor structures may, but need not, be drawn generally rectangular, with or without notches, and may be subject to feature rounding as illustrated in FIGS. 2E and 2F below. In this regard, the capacitor structures and the conductive bitline structures may be of any size and shape within the scope of the invention and the appended claims, wherein the capacitors have at least one corner.

Although the exemplary device 102 provides bitline contacts 146*b* located near corners of four ferroelectric capacitor structures $C_{FE}$ to couple a source/drain 124*b* to conductive bitline routing structures in interconnect layers formed above the capacitor layer, the invention is not limited to the illustrated structures. In another possible implementation, the bitline contacts may be located near the corners of three ferroelectric capacitor structures $C_{FE}$, for example, in which one big capacitor $C_{FE}$ is situated near two smaller ferroelectric capacitors $C_{FE}$, wherein the capacitor corners 142 generally face one another at about 120 degree angles. In this regard, the invention contemplates placement of a bitline or other conductive via or contact structure passing through a ferroelectric capacitor layer (e.g., a dielectric layer or level in which the ferroelectric capacitors are formed) near at least one capacitor structure corner 142.

In accordance with the present invention, moreover, the illustrated device 102 provides angled active regions 122, wherein the exemplary (e.g., circled) cell 106 has a straight active region 122 (FIG. 2A) disposed along the active region axis 104 at an oblique angle THETA with respect to the wordline axis 105. The angled orientation of the active region 122 allows narrower active regions 122 than the active regions 12 in the device 2 above (FIG. 1B), thereby facilitating reduced bitline capacitance in the device 102. In addition, the spacing between the active regions 122 in the device 102 is larger than is the case in the device 2 above. These features provide reduced bitline capacitance whereby higher SNR can be achieved for the same number of cells per bitline and/or the number of cells per bitline can be increased. Thus, the invention provides a technique for controlling or reducing bitline capacitance that may be employed alone or in combination with placement of the bitline contacts 146*b* at the ferroelectric capacitor corners 142 to achieve high cell density without sacrificing sense margin in the device 102.

The lithographic fabrication processing involved in fabricating the various layers and structures of the device 102 may result in feature rounding. This effect is illustrated in FIGS. 2E and 2F for two levels of the exemplary device 102. In this example, the conductive contacts 136 and the angled active regions 122 are rounded (FIG. 2E), together with the capacitor structures CFE, the conductive bitline landing pads 150*b* in ILD2 154, and the conductive bitline vias 146*b* (FIG. 2F) passing near the capacitor corners 142. The natural rounding of polysilicon wordlines 130 that occurs due to the lithography process will smooth out the structure of the polysilicon wordlines 130 and may inhibit or prevent the formation of wordline structures 130 having too narrow a polysilicon width.

As illustrated in FIG. 2F, notching of the corners 142 near the bitline vias 146 may facilitate control of a spacing distance 170 between the capacitors $C_{FE}$ and the bitline contacts 146*b* such that the capacitor structures $C_{FE}$ and the vias 146 may be designed for minimizing cell area and/or for maximizing capacitor area relative to cell area. Depending on lithography and other process constraints, notches in the corners of the capacitor (e.g., notches 142) are not needed. Thus, the invention is not limited to capacitor structures having recessed or notched corners, wherein any shape of capacitor structure corner is contemplated as falling within the scope of the invention and the appended claims.

Figure 3A:
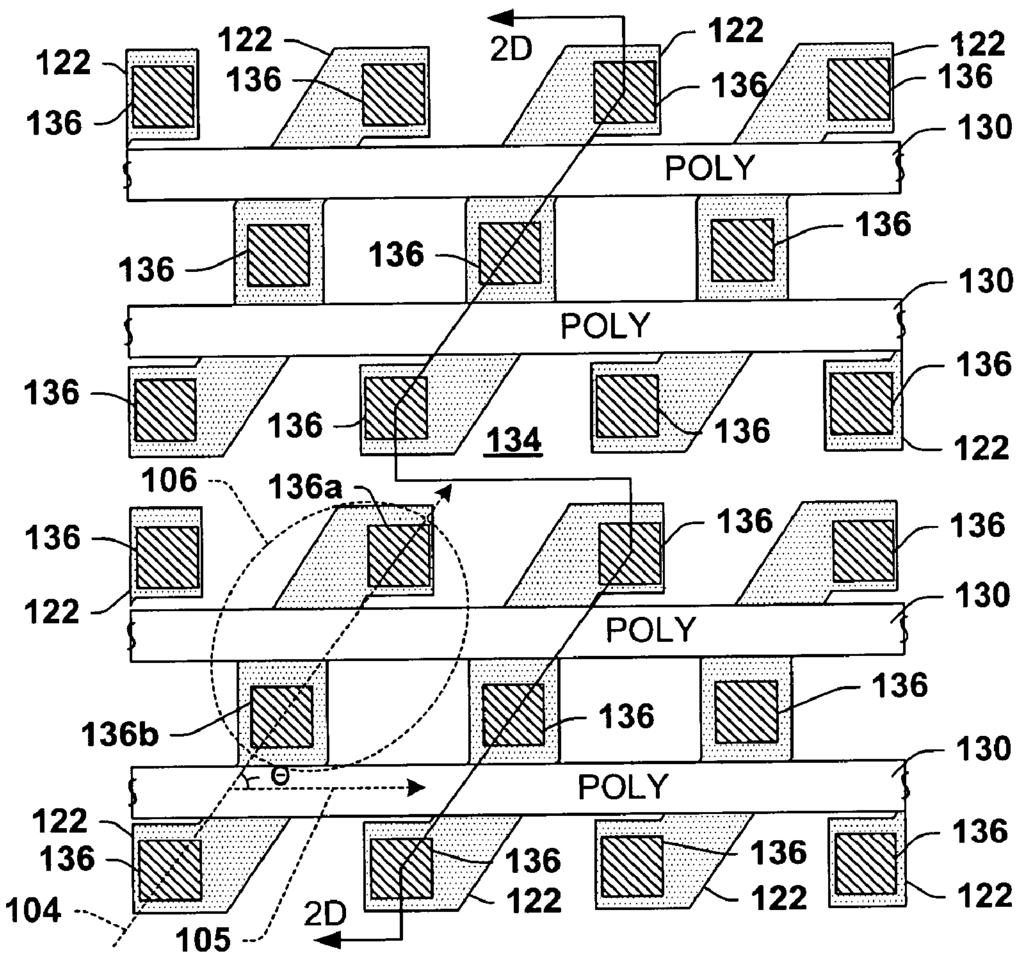
FIGS. 3A and 3B are partial top plan views in section taken along line 2A—2A, of FIG. 2D illustrating an alternative implementation having S-shaped active regions at an oblique angle with respect to the wordlines shown with and without feature rounding, respectively, in accordance with the invention.
Figure 3B:
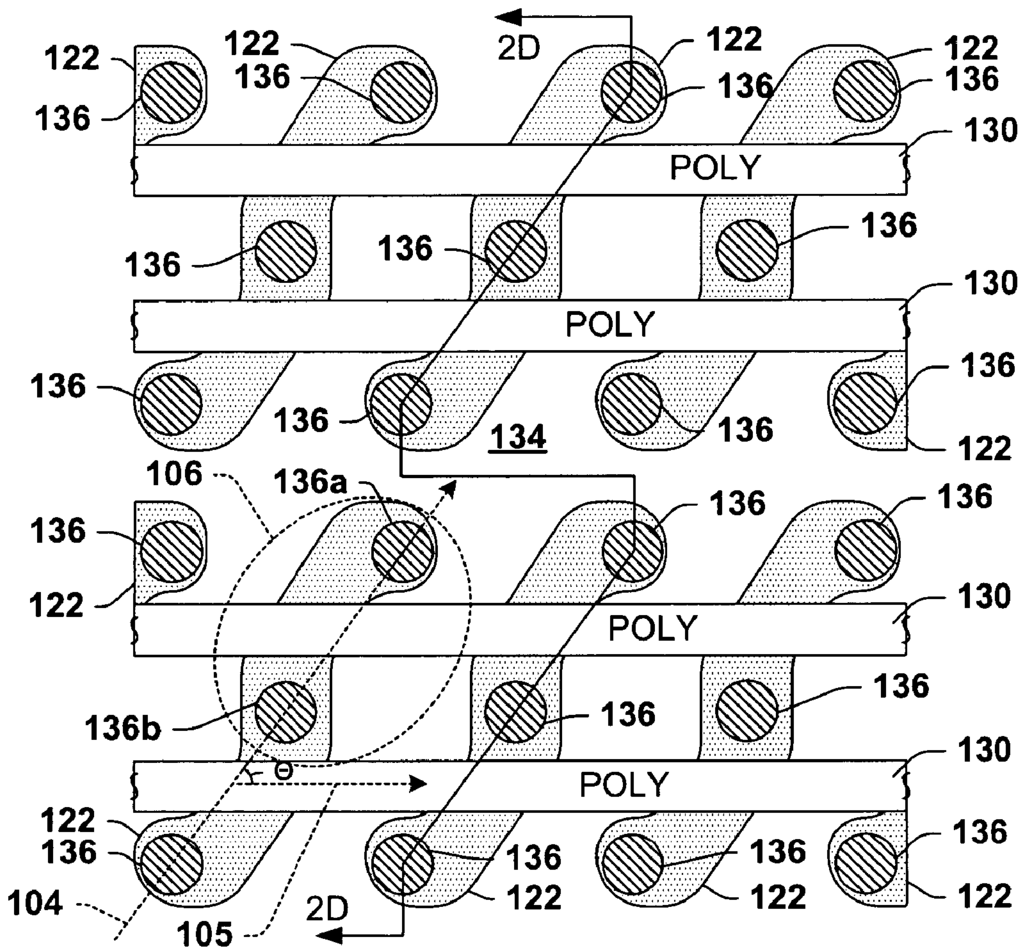

Referring also to FIGS. 3A, 3B, 4A, and 4B, the angled active regions or areas 122 may be of any shape and/or size within the scope of the invention. In the implementation of FIGS. 2B and 2E (e.g., with and without feature rounding), the active regions 122 are patterned as straight regions implanted to form source/drains 124 along the axis 104. As shown in FIGS. 3A and 3B, the active regions 122 may alternatively be curved while still extending generally along the oblique axis 104. FIG. 3A illustrates one example where the active region 122 is drawn generally as an S-shape having a central portion substantially perpendicular with the wordline axis 105, and end portions substantially parallel with the axis 105, where intermediate portions passing under the wordlines 130 are generally parallel to the active region axis 104. It is noted in this alternate implementation that the overall active region 122 is disposed along the oblique active region axis 104. FIG. 3B illustrates this example where lithographic feature rounding increases the radius at the corners of the various features in the device 102.

Figure 4A:
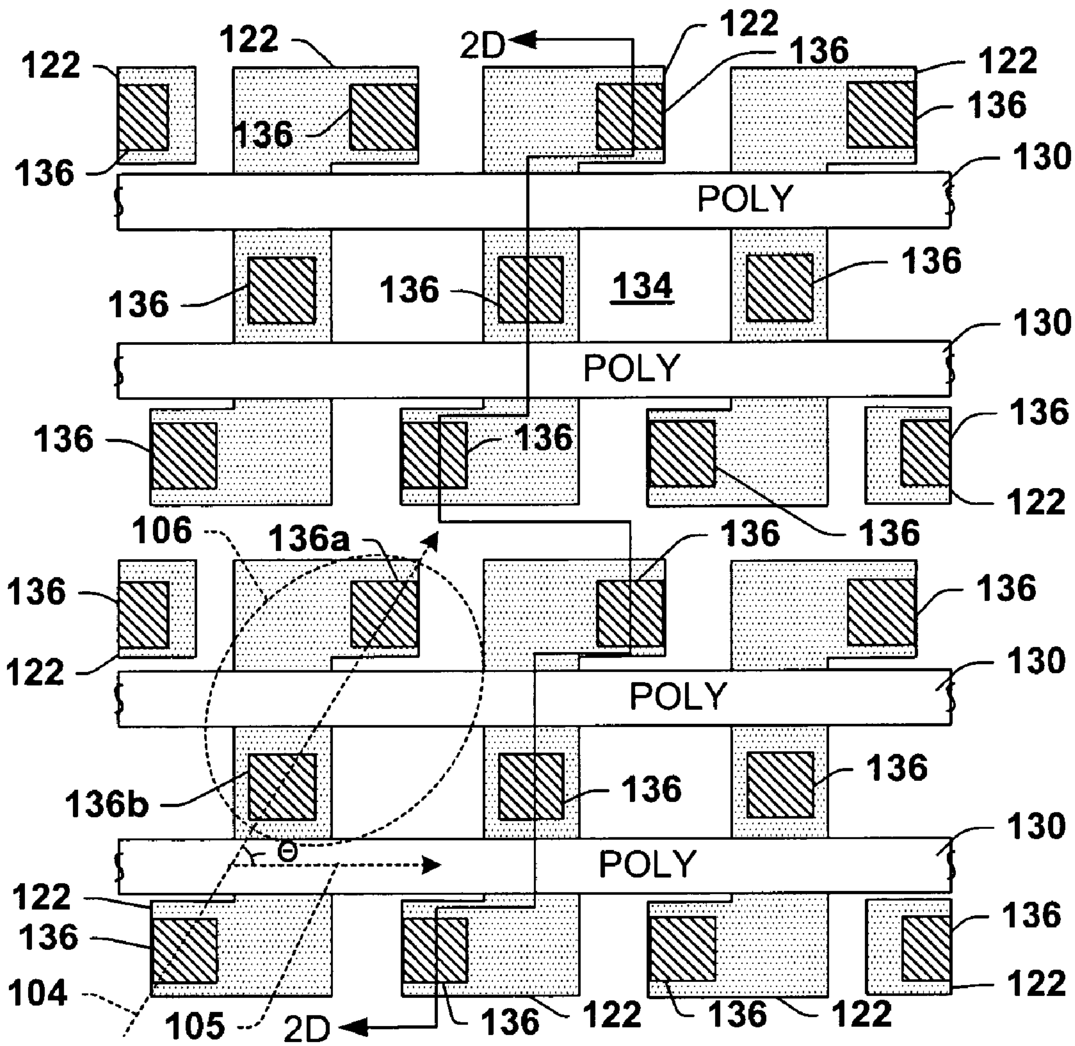
FIGS. 4A and 4B are partial top plan views in section taken along line 2A—2A of FIG. 2D illustrating yet another implementation of the invention having active regions at an oblique angle with respect to the wordlines shown with and without feature rounding, respectively.
Figure 4B:
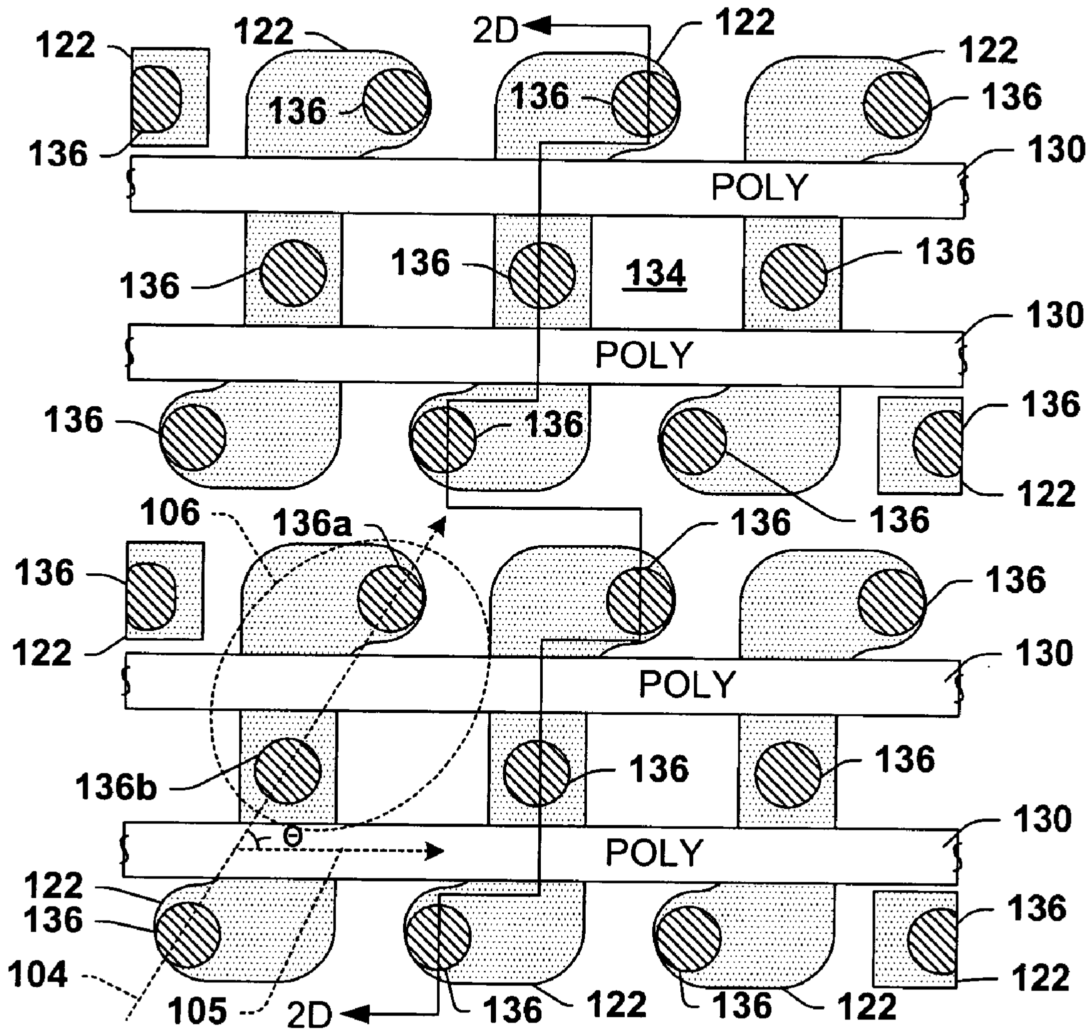

FIGS. 4A and 4B illustrate another possible implementation (e.g., with and without feature rounding, respectively), in which the individual active regions 122 are drawn in FIG. 4A as a double-L shapes having central portions generally perpendicular with the wordline axis 105 and end portions generally parallel with the axis 105. As with the other illustrated examples, the overall active region 122 in FIGS. 4A and 4B extends along an oblique active region axis 104. It is appreciated that the active region axis 104 may, but need not, pass through the ends of the active region 122 within the scope of the present invention. In the examples of FIGS. 4A and 4B, it is noted that the central portions of the active regions 122 are generally perpendicular near the polysilicon gate/wordline structures 130. As a result, current crowding and reliability problems are lessened compared with other implementations where the active regions 122 cross the wordlines 130 at a non-perpendicular angle (e.g., FIG. 2A). However, the bitline capacitance in the examples of FIGS. 4A and 4B is more likely to increase as a result of misalignment of the polysilicon gate/wordline structures 130 in the direction perpendicular to the wordline axis 105.

The invention may be implemented in any type of memory cell array configuration, wherein an example of an open bitline architecture is illustrated in FIG. 2H for the device 102. In the array of FIG. 2H, rows of data along wordlines WL1–WL4 may be read and written in a single memory access operation using complementary bitline pairs BL1/BL1'–BL4/BL4' organized along array columns. In the open bitline architecture, half the illustrated portion of the array is situated above a row of differential sense amps SA01–SA04 along odd numbered wordlines WL1, WL3, and the other half is below the sense amps along even numbered wordlines WL2, WL4. Although only four rows and four columns are illustrated in FIG. 2H, the array may be of any desired column and row lengths. A plateline signal 162 is selectively provided by control circuitry (not shown) to one terminal of the cell capacitors being accessed, and the other side of the selected capacitors $C_{FE}$ are connected to the corresponding bitlines BL1/BL1'–BL4/BL4' through the associated cell transistor T that is activated by the wordline signals WL provided by a row decoder circuit 168.

Read and write operations are performed along the rows of the array, where the decoder 168 selects a desired row based on address information (not shown), and asserts a corresponding wordline WL. For a write operation, the sense amps SA01–SA04 provide a differential voltage across the bitline pairs BL1/BL1'–BL4/BL4', wherein the polarities of the differential voltages are representative of the data to be stored in the row of cells 106 being accessed. A plateline signal 162, such as a low-high-low pulse is applied to the array, to create a voltage potential across the ferroelectric capacitors of the selected cells 106. The resulting electric field in the ferroelectric material of the accessed cell capacitors $C_{FE}$ provides polarization of dipoles in the ferroelectric material, by which a known, non-volatile memory cell data state is established in each of the accessed cells 106.

In a read operation, the decoder 168 selects the row of interest by asserting one of the wordlines WL, and the plateline signal 162 is again applied to the array. The accessed cell capacitors $C_{FE}$ are thereby coupled between the plateline voltage 162 and one of the complementary bitlines, with the other bitline being held at a reference voltage level. The sense amps SA01–SA04 sense differential voltages across the complementary bitline pairs BL1/BL1'–BL4/BL4', which correspond to the memory cell data states prior to the read operation. The data states may then be transferred to 10 buffer circuitry (not shown), and are then refreshed back into the memory cells 106. Other array configurations are possible within the scope of the invention, including but not limited to folded bitline architectures, chain FRAM configurations, and others.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A ferroelectric memory cell, comprising:

a ferroelectric capacitor formed in a capacitor layer above a semiconductor body;

a cell transistor comprising:

first and second source/drains formed in an active region of the semiconductor body, the active region extending along a first axis in the semiconductor body, and a gate electrically coupled with a wordline structure that extends along a second axis, wherein the first axis and the second axis are obligue; and a bitline contact coupled with the second source/drain and extending from beneath the capacitor layer to a layer above the capacitor layer, the bitline contact passing through the capacitor layer proximate a corner of the ferroelectric capacitor.

2. The ferroelectric memory cell of claim 1, wherein the active region is straight.

3. The ferroelectric memory cell of claim 1, wherein the active region is curved.

4. The ferroelectric memory cell of claim 3, wherein the active region is S-shaped.

5. The ferroelectric memory cell of claim 1, wherein the first axis passes through first and second ends of the active region.

6. The ferroelectric memory cell of claim 5, wherein a portion of the active region extends substantially parallel to the second axis.

7. The ferroelectric memory cell of claim 5, wherein a first portion of the active region extends substantially perpendicular to the second axis.

8. The ferroelectric memory cell of claim 7, wherein a second portion of the active region extends substantially parallel to the second axis.

9. A ferroelectric memory array, comprising:

a plurality of ferroelectric memory cells accessible along a plurality of bitlines using a plurality of plateline signals and a plurality of wordline signals for storing data, the ferroelectric memory cells individually comprising:

a ferroelectric capacitor formed in a capacitor layer above a semiconductor body;

a cell transistor comprising:

a first source/drain formed in an active region of a semiconductor body, the active region extending alone a first axis in the semiconductor body, the first source/drain being electrically coupled with the ferroelectric capacitor;

a second source/drain formed in the active region, the second source/drain being electrically coupled with a bitline structure, and a gate electrically coupled with a wordline structure that extends along a second axis, wherein the first axis and the second axis are obligue; and a bitline contact coupling the second source/drain to the bitline structure, wherein the bitline contact extends from beneath the capacitor layer to a layer above the capacitor and passes through the capacitor layer proximate a corner of the ferroelectric capacitor.

10. The ferroelectric memory array of claim 9, wherein the active regions are shared by two adjacent cell transistors in the array.

11. The ferroelectric memory array of claim 9, wherein the active regions are straight.

12. The ferroelectric memory array of claim 9, wherein the active regions are curved.

13. The ferroelectric memory array of claim 12, wherein the active regions are S-shaped.

14. The ferroelectric memory array of claim 9, wherein the first axes of the individual active regions pass through first and second ends of a corresponding active region in the array.

15. The ferroelectric memory array of claim 14, wherein portions of the individual active regions extend substantially parallel to the second axis.

16. The ferroelectric memory array of claim 14, wherein first portions of the individual active regions extend substantially perpendicular to the second axis.

17. The ferroelectric memory array of claim 16, wherein second portions of the individual active regions extend substantially parallel to the second axis.

* * * * *